(12) United States Patent
Vijaykumar et al.

(10) Patent No.: US 10,116,268 B2
(45) Date of Patent: Oct. 30, 2018

(54) OPERATIONAL AMPLIFIER

(71) Applicant: Analog Devices Global, Hamilton (BM)

(72) Inventors: Sharad Vijaykumar, Bangalore (IN); Gerard Mora-Puchalt, Catarroja (ES)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/401,522

(22) Filed: Jan. 9, 2017

(65) Prior Publication Data
US 2018/0198417 A1    Jul. 12, 2018

(51) Int. Cl.
*H03F 1/30* (2006.01)
*H03F 1/26* (2006.01)
*H03F 3/45* (2006.01)

(52) U.S. Cl.
CPC .............. *H03F 1/301* (2013.01); *H03F 1/26* (2013.01); *H03F 3/45273* (2013.01); *H03F 3/45753* (2013.01); *H03F 2203/45462* (2013.01)

(58) Field of Classification Search
CPC .................................................. H03F 3/45892
USPC ..................... 330/9; 327/124, 307
See application file for complete search history.

(56) References Cited

U.S. PATENT DOCUMENTS

| | | | |
|---|---|---|---|
| 5,796,300 A | 8/1998 | Morgan | |
| 6,194,962 B1 | 2/2001 | Chen | |
| 6,380,801 B1 | 4/2002 | McCartney | |
| 6,734,723 B2* | 5/2004 | Huijsing | H03F 3/45982 330/9 |
| 7,023,266 B2 | 4/2006 | Chung | |
| 7,068,095 B2* | 6/2006 | Bernardon | H03F 3/195 330/10 |
| 7,321,260 B2* | 1/2008 | Larson | H03F 3/45995 330/51 |
| 7,408,406 B2* | 8/2008 | Hickman | H03F 3/211 330/147 |
| 7,706,480 B2* | 4/2010 | Stojanovic | H04L 25/063 375/219 |
| 7,852,252 B2* | 12/2010 | Ge | H03F 3/45475 341/155 |

(Continued)

FOREIGN PATENT DOCUMENTS

WO    WO-2015013023 A2    1/2015

OTHER PUBLICATIONS

Datasheet for Analog Devices AD8657, 18V, Precision, Micropower CMOS RRIO Operational Amplifier, Mar. 2011, 24 pages.

*Primary Examiner* — Henry Choe
(74) *Attorney, Agent, or Firm* — Knobbe Martens Olson & Bear LLP

(57) ABSTRACT

The amplifier circuit includes a pair of differential input stages coupled to an output stage where both a selected input stage and an unselected input stage are active with one of either a differential input signal or a reference voltage. A switching network couples a first input differential signal to a first differential input stage and a reference voltage to a second differential input stage when an amplifier input signal is less than a threshold voltage. The switching circuit also couples the second input differential signal to the second differential input stage and the reference voltage to the first differential input stage when the amplifier input signal is greater than the threshold signal.

22 Claims, 16 Drawing Sheets

(56) References Cited

U.S. PATENT DOCUMENTS

| | | | |
|---|---|---|---|
| 8,253,470 B2* | 8/2012 | Mulder | H03F 3/45192 |
| | | | 327/306 |
| 8,428,196 B2* | 4/2013 | Stojanovic | H04L 25/063 |
| | | | 375/229 |
| 8,624,668 B2* | 1/2014 | Wan | H03F 3/45475 |
| | | | 330/9 |
| 8,854,135 B2 | 10/2014 | Cuenca et al. | |
| 8,988,402 B2* | 3/2015 | Tsuchi | H03F 1/0261 |
| | | | 330/253 |
| 9,312,825 B2 | 4/2016 | Maurino | |
| 2002/0135424 A1* | 9/2002 | Oikawa | G05F 3/262 |
| | | | 330/288 |
| 2008/0284507 A1 | 11/2008 | Pertijs et al. | |
| 2013/0069720 A1 | 3/2013 | Reisiger | |
| 2014/0022014 A1 | 1/2014 | Reisiger | |
| 2015/0288336 A1* | 10/2015 | Kusuda | H03F 3/387 |
| | | | 330/9 |

* cited by examiner

OPERATIONAL AMPLIFIER

FIELD OF THE DISCLOSURE

This document pertains generally, but not by way of limitation, to the field of integrated circuits and, in particular, to amplifier circuits with chopper circuits.

BACKGROUND

An amplifier offset voltage may be defined as a voltage that is applied between the two input terminals of the amplifier in order to obtain zero volts at the output. Ideally, the output of the amplifier circuit should be at zero volts when the inputs are grounded. However, in practice, the input terminals are at slightly different voltages due to inherent mismatches of input transistors and components during fabrication of the silicon die. These effects collectively produce a mismatch of the bias currents that flow through the input circuit resulting in a differential voltage at the input terminals of the amplifier circuit. Amplifier offset voltages have been reduced with modern manufacturing processes through increased component matching and improved package materials and assembly but they have not been eliminated and may cause errors in signal amplification during circuit operation.

A chopper circuit is a switching device that converts a fixed DC input signal to a variable DC output signal. Essentially, a chopper circuit is an electronic switch that is used to interrupt one signal under the control of another. Chopper circuits may be used in amplifier circuits to further reduce offset voltages and low frequency noise of an amplifier circuit. One type of chopper circuit is disclosed in U.S. Pat. No. 6,380,801 to McCartney. However, for an offset voltage to be cancelled out while chopping, the offset voltage should remain constant for all chop phases.

SUMMARY OF THE DISCLOSURE

The inventors have recognized, among other things, a need for an amplifier circuit having a reduced or canceled offset voltage. The amplifier circuit includes a pair of differential input stages coupled to an output stage where both a selected input stage and an unselected input stage are active with one of either a differential input signal or a common mode voltage. A switching network couples a first input differential signal to a first differential input stage and a common mode voltage to a second differential input stage when an amplifier input signal is less than a threshold value. A second input differential signal is completely removed from the amplifier signal chain when the first input differential signal is coupled to the amplifier input. The switching circuit also couples the second input differential signal to the second differential input stage when the amplifier input signal is greater than the threshold value. The first input differential signal is completely removed from the amplifier chain when the second input differential signal is coupled to the amplifier input. Thus, any residual voltage offset remains reasonably constant over the entire input voltage range and there are no voltage spikes in the residual offset voltage.

One example includes an amplifier circuit that generates an output voltage comprising a relatively constant offset voltage. The amplifier circuit includes two differential input stages, a first one of the stages comprising a pair of first input transistors and a second one of the stages comprising a pair of second input transistors, the second input transistors being complementary in type to the first input transistors. An output stage is coupled to the two differential input stages, the output stage configured to generate the output voltage. A comparator circuit is coupled to an amplifier circuit input signal and a threshold signal, the comparator circuit configured to generate a control signal in response to a difference between the input signal and the threshold signal. A switching network is configured to couple a first input signal to the first differential input stage and a common mode voltage to the second differential input stage in response to the control signal having a first state and the switching network further configured to couple a second input signal to the second differential input stage and the common mode voltage to the first differential input stage in response to the control signal having a second state.

Another example includes an amplifier circuit that removes offset voltages from an output voltage. The circuit includes two differential input stages, a first differential input stage being complementary in type to a second differential input stage. An output stage is coupled to the two differential input stages where the output stage is configured to generate the output voltage in response to a differential input signal. A comparator circuit is coupled to a differential input signal node and a threshold signal node. The comparator circuit is configured to generate a control signal in response to a difference between an input signal on the differential input signal node and a threshold signal on the threshold signal node. A switching network is coupled to the comparator circuit and configured to select one of the first differential input stage or the second stage by switching the input signal to the selected stage in response to the control signal, wherein an unselected stage of the first or second differential input stage is active. One of a chopper function or an auto-zero function removes the offset voltage.

Yet another example includes a method for amplifier offset voltage removal. The method includes switching a differential voltage to a first of a pair of differential input stages. A common mode voltage is switched to the differential input stage that is not coupled to the differential voltage while the differential voltage is coupled to the first differential input stage. An amplifier output voltage is generated in response to the differential voltage, the output signal having an offset voltage. The offset voltage is removed from the output voltage.

This section is intended to provide an overview of the subject matter of the present patent application. It is not intended to provide an exclusive or exhaustive explanation of the invention. The detailed description is included to provide further information.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Some amplifier applications (e.g., operational amplifiers, analog-to-digital converter (ADC) sample and hold circuit) may require that the amplifier circuit operate with its inputs very close to, or even beyond, both voltage supplies of the amplifier. Such an amplifier circuit may be referred to in the art as having a rail-to-rail input voltage range. These amplifiers generally have two differential input pairs. The transistors in one of the differential pair is complementary in type to the transistors in the other pair. A block diagram of an amplifier circuit is provided in FIG. 1 described subsequently.

Figure 2:
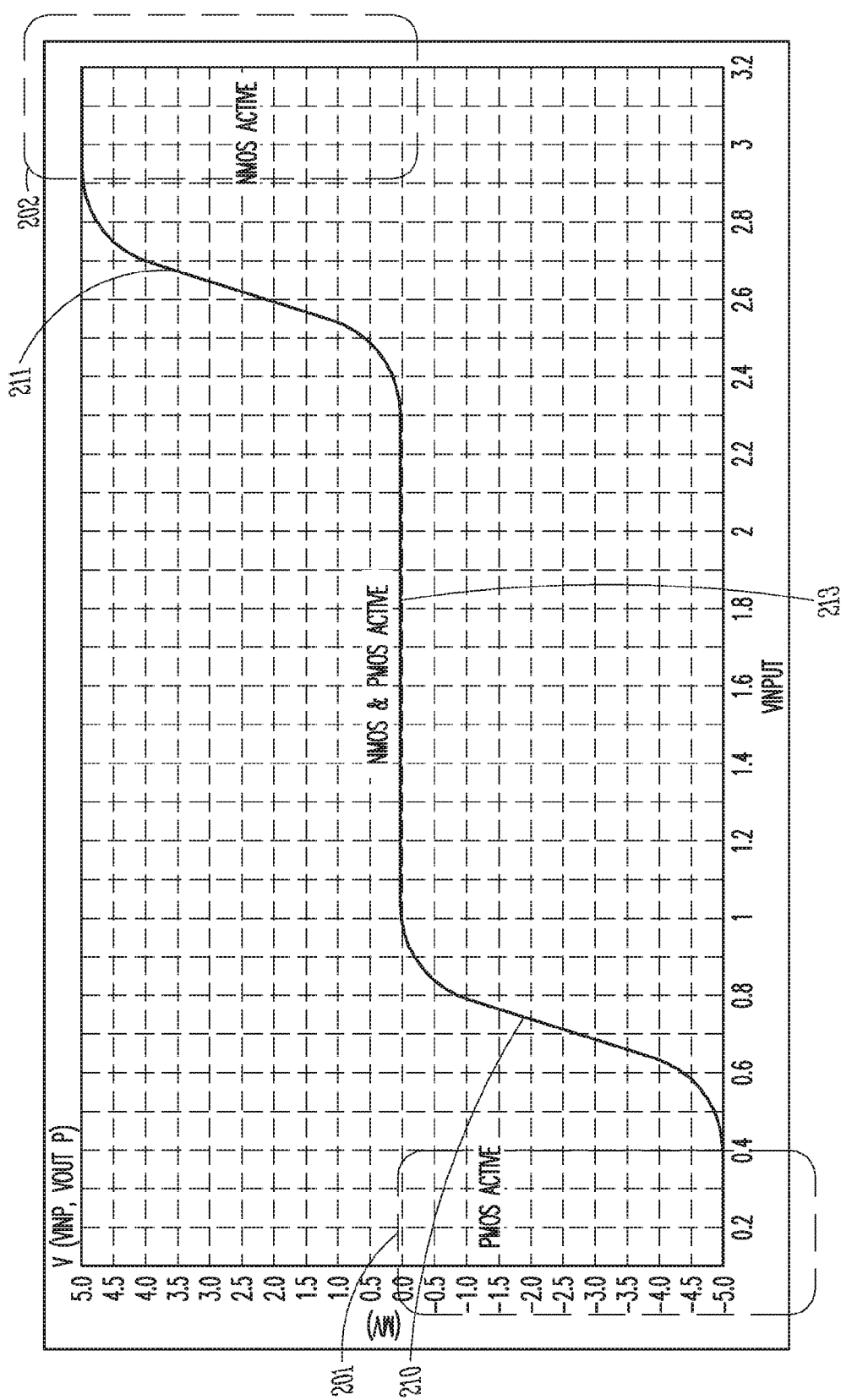
FIG. 2 is a plot of an amplifier offset voltage variation with input common mode voltage, such as in accordance with the embodiment of FIG. 1.
Figure 3:
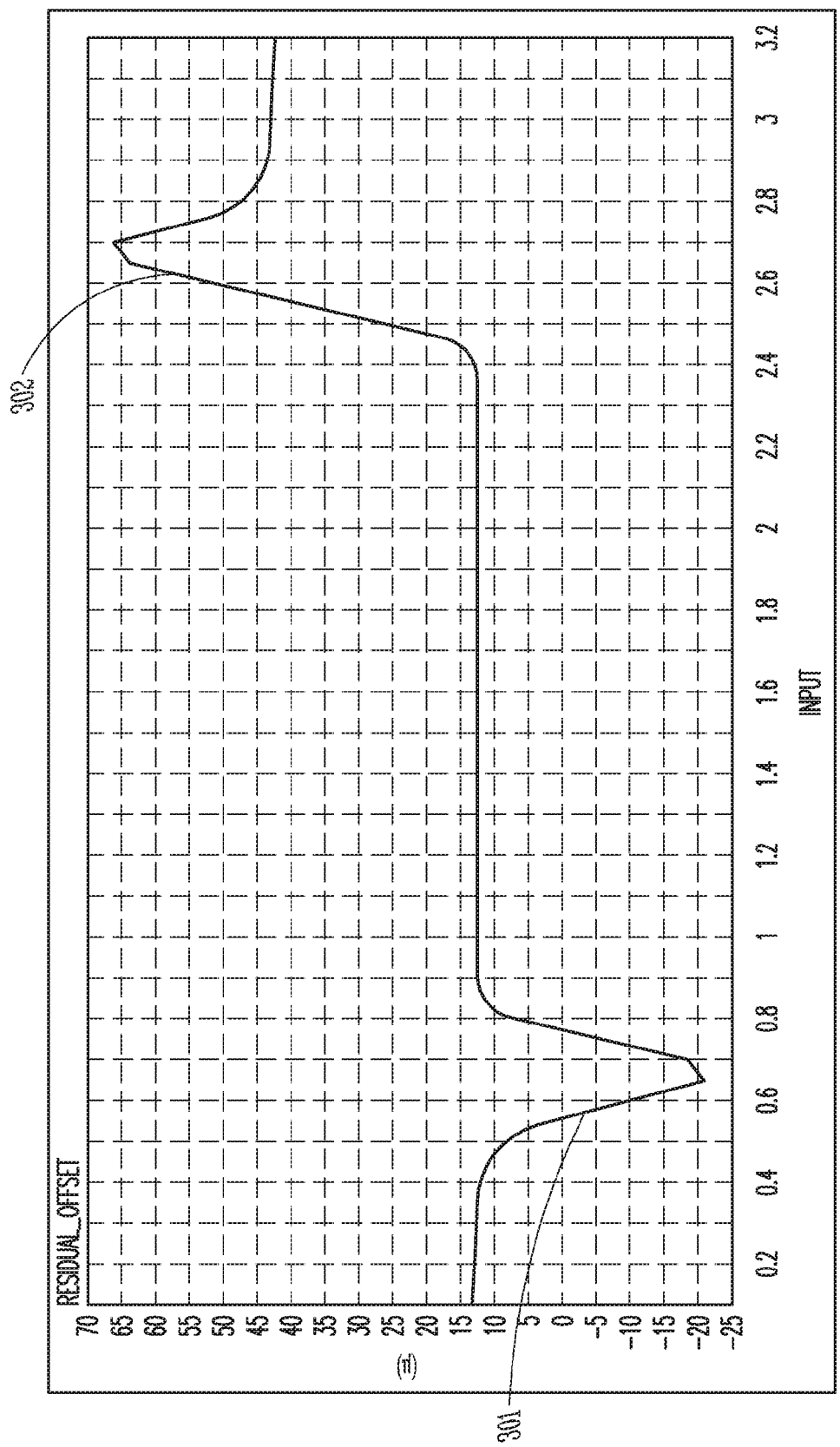
FIG. 3 is a plot of residual amplifier offset voltage, such as in accordance with the embodiment of FIGS. 1 and 2.

Rail-to-rail amplifier circuits may generate an offset voltage during operation as a result of inherent mismatches of components during fabrication. In such circuits, one of the two differential input pairs is inactive and/or not coupled to the current mirror stage while the input voltage is in a certain voltage range and the other differential input pair is active. The offset voltage of such an amplifier is shown in FIG. 2. This kind of offset that varies non-linearly with the input voltage results in non-linearity of the output voltage. These offset voltages cannot be completely removed using chopping or auto-zero. A chopper function typically requires that the offset voltage be stable during both phases of the chopper circuit operation. While chopper stabilization works well in amplifier circuits having a single differential input pair, problems may arise in chopping an amplifier circuit having two differential input pairs. The residual offset after chopping of such an amplifier is shown in FIG. 3.

Figure 1:
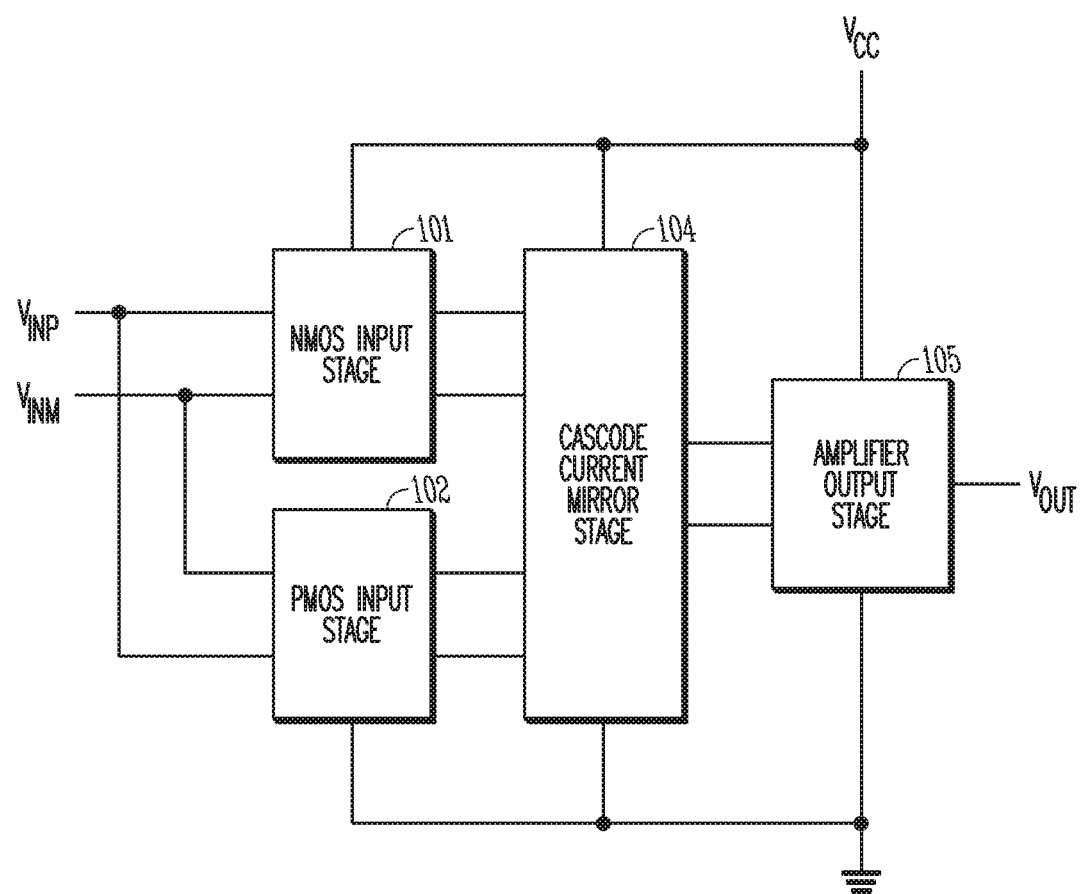
FIG. 1 is a block diagram of an amplifier circuit, such as in accordance with various embodiments.

FIG. 1 is a block diagram of an amplifier circuit, such as in accordance with various embodiments. The amplifier circuit includes an n-type metal oxide semiconductor (NMOS) input stage 101, a p-type MOS (PMOS) input stage 102, a cascode current mirror stage 104, and an amplifier output stage 105. Such an amplifier may be used in an ADC sample and hold circuit as well as other uses.

The NMOS input stage 101 and the PMOS input stage 102 are coupled to differential input voltages $V_{inp}$ (i.e., positive input voltage) and $V_{inm}$ (i.e., negative input voltage) that may also be referred to as inverting and non-inverting input signals. The output of the current mirror stage 104 is input to the amplifier output stage 105. The amplifier output stage 105 generates the amplified output voltage Vow based on the differential input voltages $V_{inp}$ and $V_{inm}$ and the feedback configuration.

In operation, the amplifier circuit includes a supply voltage via upper voltage rail $V_{cc}$ (e.g., 5V) and lower voltage rail (e.g., GND). A differential voltage (e.g., $V_{inp}$, $V_{inm}$) is input to the NMOS and PMOS input stages 101, 102. The PMOS input stage 102 is active during a lower part of the input voltage range.

The NMOS input stage 101 is active during the upper part of the input voltage range. An example of this operation is illustrated in FIG. 2.

FIG. 2 is a plot of an amplifier offset voltage variation with input common mode voltage, such as in accordance with various embodiments. The input voltage $V_{input}$ is along the x-axis, in Volts, and the output voltage is along the y-axis in millivolts (mV).

The plot shows the various regions of operation of the amplifier circuit components. For example, for a lower input voltage range 201 (e.g., 0 to 0.4V) only the PMOS input stage 102 of FIG. 1 is active. For a higher input voltage range 202 (e.g., 2.8V to 3.2V), only the NMOS input stage 101 of FIG. 1 is active. The center of the plot 213 shows the output voltage where both the NMOS input stage 101 and the PMOS input stage 102 are active.

Between the lower voltage range 201 and the mid-range 213, there is a transition voltage 210 that increases from the lower voltage range 201 to the mid-range 213. Between the mid-range 213 and the higher input voltage range 202, there is a transition voltage 211 that increases from the mid-range 213 to the higher range 202. This non-linearity of the offset voltage results in the non-linearity of the amplifier output voltage. Chopping such an amplifier cannot completely remove this non-linearity. The transition voltages 210, 211 create residual offset voltage spikes as illustrated in FIG. 3. Chopping requires the offset voltage to remain constant for both the chop phases. This is not true at the transition regions 210 and 211.

FIG. 3 is a plot of residual amplifier offset voltage, such as in accordance with the embodiment of FIG. 1. The input voltage $V_{input}$ is along the x-axis, in Volts, and the residual offset voltage is along the y-axis in microvolts (µV).

This plot illustrates the voltage spikes 301, 302 that occur during the voltage transitions 210, 211 of FIG. 2. Thus, the disclosed embodiments may be used to reduce or eliminate these voltage spikes in order to maintain a relatively constant offset voltage from the amplifier circuit.

The mismatch current of the circuit of FIG. 1 may be represented by $\Delta I_{PMOS} = \Delta I_P + \Delta I_M$ when the PMOS stage 102 is active and $\Delta I_{NMOS} = \Delta I_N + \Delta I_M$ when the NMOS stage 101 is active, where $\Delta I_P$ represents the mismatch current between the two legs of the PMOS differential input stage 102, $\Delta I_N$ represents the mismatch current between the two legs of the NMOS differential input stage 101, and $\Delta I_M$ represents the mismatch of the current mirror stage 104. Thus, the input referred offset voltage induced when the PMOS input stage is active may be represented by $$V_{osp} = \frac{\Delta Ipmos}{gmp}$$

and the offset voltage induced when the NMOS input stage 101 is active may be represented by $$V_{osn} = \frac{\Delta Inmos}{gmn},$$

where $g_{mn}$ is the trans-conductance of the input pair of the NMOS input stage 102 and $g_{mp}$ is the trans-conductance of the input pair of the PMOS input stage 101.

The embodiments of FIGS. 4-7 provide a more stable offset voltage. By connecting both differential input pairs to the current mirror during operation and switching a reference voltage to the input of the differential input pair while the other differential input pair is coupled to the differential input voltage, both input stages may remain active and directly connected to the current mirror stage without switching. The current mirror stage is also directly connected to the output stage without switching. The mismatch current remains the same irrespective of which input pair is chosen. This can be expressed as $\Delta I=\Delta I_P+\Delta I_M+\Delta I_N$. The input referred offset when the PMOS input pair is active can be expressed as $$Vosp = \frac{\Delta I}{gmp}$$

and the same when the NMOS input pair is active can be expressed as $$Vosn = \frac{\Delta I}{gmn}.$$

The difference in these two offsets is $\Delta I$ $$\left(\frac{gmn - gmp}{gmp * gmn}\right).$$

This quantity is much smaller than the offset steps seen in FIG. 2. This is because in a traditional rail ro rail amplifier, the difference in offset is $(\Delta I_N+\Delta I_M)/g_{mn}-(\Delta I_P+\Delta I_M)/g_{mp}$. $\Delta I_P$ and $\Delta I_N$ are independent quantities and can have opposite signs. This causes the offset difference to be large.

Figure 4:
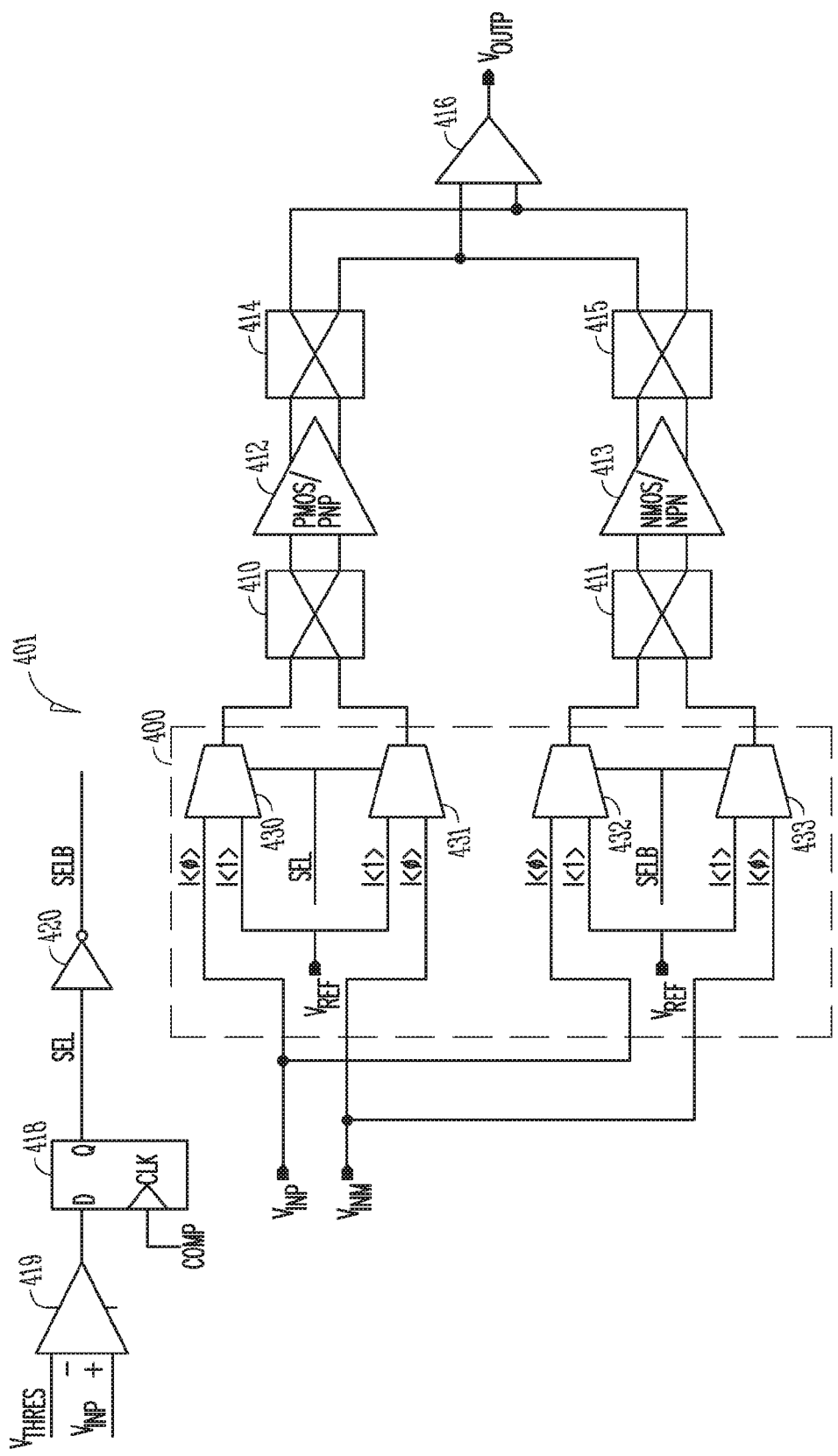
FIG. 4 is a block diagram of an example of an amplifier circuit with chopper circuits for offset voltage cancellation, such as in accordance with various embodiments.

FIG. 4 is a block diagram of an example of an amplifier circuit with chop circuits for offset voltage cancellation, such as in accordance with various embodiments. The circuits include a switching network, comprising four multiplexers 430-433, chopper circuits 410, 411, 414, 415 (e.g., chopper function), complementary differential input amplifier stages 412, 413, an output stage 416, and a comparator circuit 401 comprising a comparator 419, a latch or flip-flop (e.g., D flip-flop) 418, and an inverter 420.

The switching network 400 is coupled to input signal nodes and a reference signal node. For example, $V_{inp}$ represents a positive input voltage node and $V_{inm}$ represents a negative input voltage node. The reference signal node, $V_{ref}$, may be any voltage where both PMOS and NMOS pairs are completely on. $V_{ref}$ may be $V_{inp}$, $V_{inm}$, or $V_{outp}$.

Each switching network multiplexer 430-433 has an input coupled to the reference signal node and another input coupled to one of the input signal nodes (e.g., $V_{inp}$, $V_{inm}$). For example, the first multiplexer 430 has inputs coupled to the $V_{inp}$ node and the $V_{ref}$ node. The second multiplexer 431 has inputs coupled to the $V_{inm}$ node and the $V_{ref}$ node. The third multiplexer 432 has inputs coupled to the $V_{inp}$ node and the $V_{ref}$ node. The fourth multiplexer 433 has inputs coupled to the $V_{inm}$ node and the $V_{ref}$ node.

Each of the multiplexers 430-433 has a switching control input that is coupled to one of a switching select signal SEL or SELB. As described subsequently with reference to the comparator circuit 401, when the switching select signal SEL is in a first state, the switching select signal SELB signal is in a second state that is opposite to the first state. For example, when SEL is a logic low, SELB is a logic high. The switching select signals may then be used to switch between one of the two signals presented on the inputs of the respective multiplexer 430-433.

Each multiplexer comprises a respective output that is coupled to an input of an input chop circuit 410, 411. For example, the respective outputs of multiplexers 430, 431 are coupled to inputs of a first input chop circuit 410. The respective outputs of multiplexer 432, 433 are coupled to inputs of a second input chop circuit 411. As described subsequently, these inputs are differential inputs. The input chop circuits 410, 411 chop the offset voltage from the input signals (e.g., $V_{inp}$, $V_{inm}$) switched through the switching network 400 prior to feeding these signals to their respective differential input stages 412, 413.

The outputs of the input chop circuits 410, 411 are input to respective differential input stages 412, 413. For example, the differential outputs of the first chop circuit 410 are coupled to the inputs of a first differential input stage 412. The differential outputs of the second chop circuit 411 are coupled to the inputs of a second differential input stage 413. In an embodiment, the first differential input stage 412 is a PMOS/PNP input stage 412 and the second differential input stage 413 is an NMOS/NPN input stage 413.

Outputs of the first and second differential input stages 412, 413 are respectively input to output chop circuits 414, 415. The outputs of output chop circuits 414, 415 are input to the output stage 416. The output stage is coupled to output signal nodes $V_{outp}$.

The comparator circuit 401 includes a comparator 419 coupled to one of the input signal nodes (e.g., $V_{inp}$) and a $V_{thres}$ signal. $V_{thres}$ represents a threshold voltage $V_{thres}$ can be generated separately and can be same as $V_{ref}$ that provides a reference voltage to which the input signal voltage is compared. The comparator 419 may have hysteresis. The output of the comparator 419 is coupled to a latch or a flip-flop 418 (e.g., D flip-flop) that outputs the SEL select signal. The latch 418 is coupled to an inverter 420 that provides the opposite state SELB select signal.

In operation, the reference signal and the differential input signals $V_{inp}$ and $V_{inm}$ are applied to the input nodes of the switching network 400. One of the input signals (e.g., $V_{inp}$) is applied to the input of the comparator that compares the input signal to the threshold voltage $V_{thres}$. If $V_{inp}$ is less than $V_{thres}$, the comparator outputs a low signal that is latched into the latch 418 by clock COMP. Thus, the select signal SEL transitions to a low signal and the select signal SELB transitions to a high signal. The low select signal SEL selects the "0" input of multiplexers 430, 431 so that the output of the multiplexers 430, 431 is the differential voltages $V_{inp}$ and $V_{inm}$. The high select signal SELB selects the "1" inputs of the multiplexers 432, 433 so that the output of the multiplexers 432, 433 is the reference voltage $V_{ref}$. Thus, the inputs to the input chop circuit 410 and its respective input stage 412 (e.g., PMOS/PNP input stage) is the differential voltages $V_{inp}$ and $V_{inm}$. The input to the input chop circuit 411 and its respective input stage 413 (e.g., NMOS/NPN input stage) is the reference voltage. Thus, while the PMOS/PNP input stage of the circuit is coupled to an input signal for amplification, the NMOS/NPN input stage is still operational with the reference voltage.

Conversely, if $V_{inp}$ is greater than $V_{ctrl}$, the comparator outputs a high signal that is latched into the latch 418 by clock COMP. Thus, the select signal SEL transitions to a high signal and the select signal SELB transitions to a low signal. The high select signal SEL selects the "1" input of multiplexers 430, 431 so that the output of the multiplexers 430, 431 is reference voltage $V_{ref}$. The low select signal SELB selects the "0" inputs of the multiplexers 432, 433 so that the output of the multiplexers 432, 433 is the differential voltages $V_{inp}$ and $V_{inm}$. Thus, the inputs to the input chop circuit 410 and its respective input stage 412 (e.g., PMOS/PNP input stage) is the reference voltage. The input to the input chop circuit 411 and its respective input stage 413 (e.g., NMOS/NPN input stage) is the differential voltages $V_{inp}$ and $V_{inm}$. Thus, while the NMOS/NPN input stage 413 of the circuit is coupled to an input signal for amplification, the PMOS/PNP input stage 412 is still operational with the reference voltage.

The input stages 412, 413 feed their respective signals into output chop circuits 414, 415. The output of the output chop circuits 414, 415 are then input to the amplifier output stage 416 to generate the output voltages $V_{outp}$.

Figure 5A:
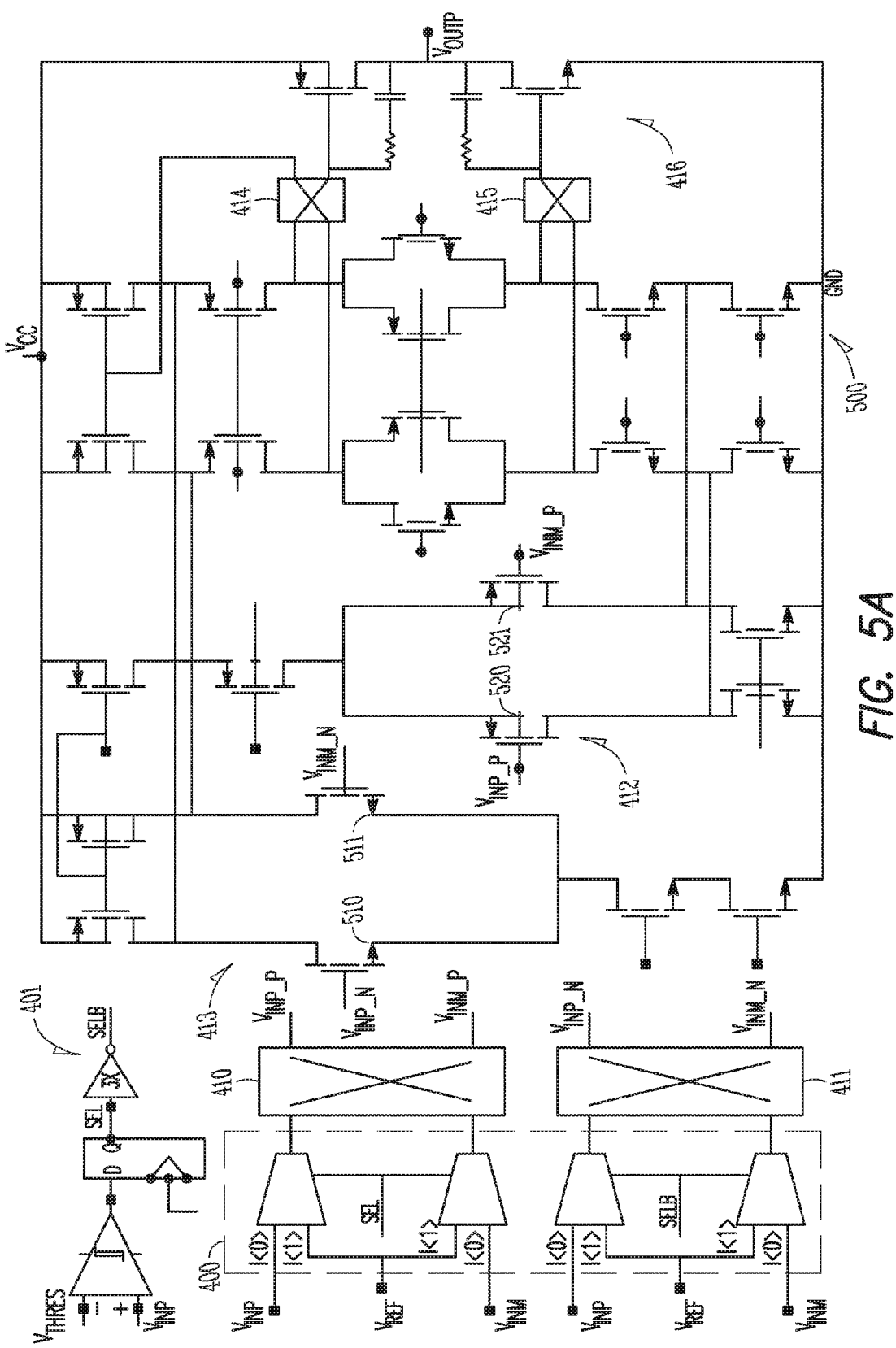
FIGS. 5A, 5B are a schematic diagram of an example amplifier circuit with and without chopper circuits for offset voltage cancellation, such as in accordance with the embodiment of FIG. 4.
Figure 5B:
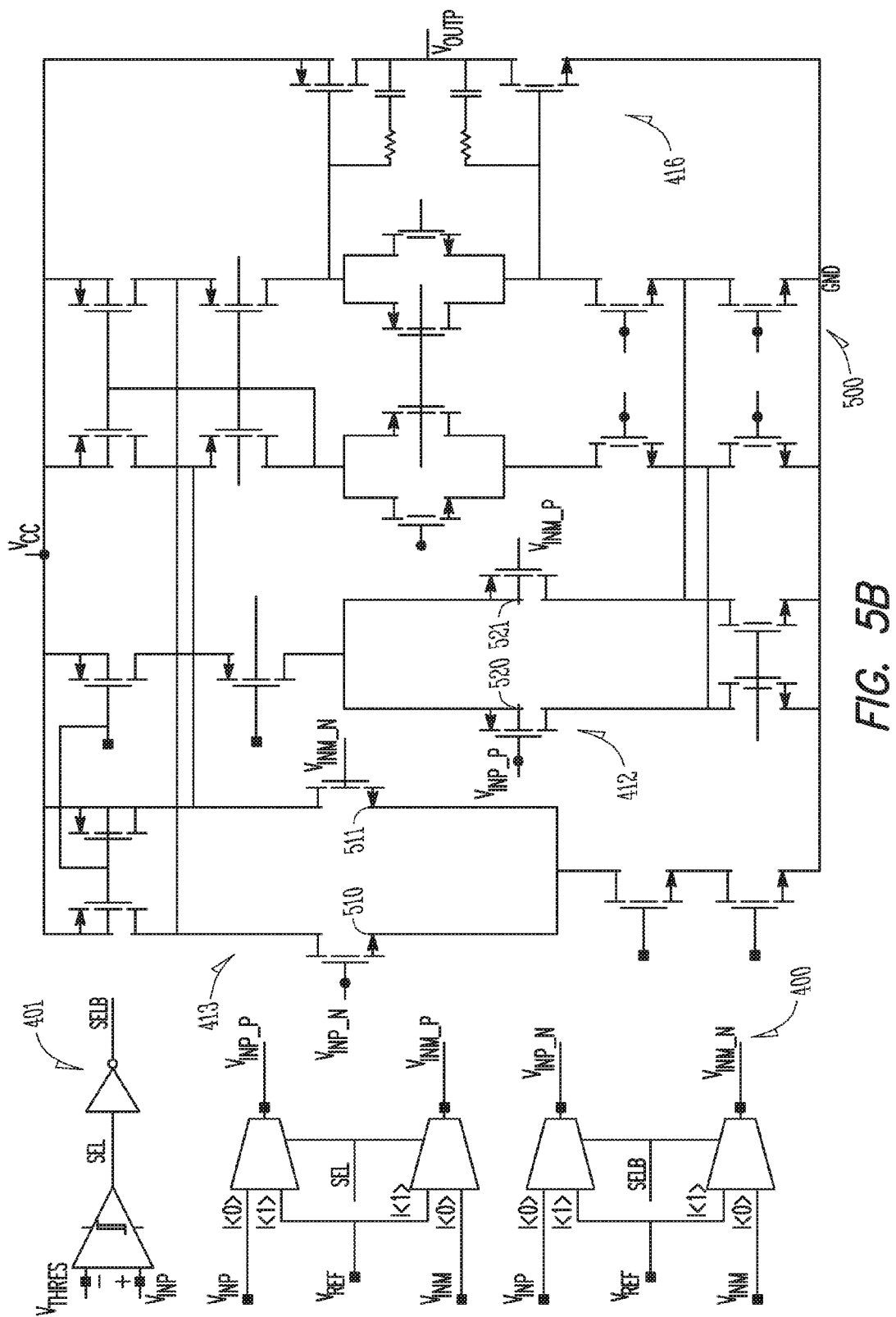

FIG. 5A is a schematic diagram of an example amplifier circuit with chop circuits for offset voltage cancellation, such as in accordance with the embodiment of FIG. 4. FIG. 5B is a schematic diagram of an example amplifier circuit without chop circuits for offset voltage cancelation, such as in accordance with the embodiment of FIG. 4. These schematics are for purposes of illustration only as other circuits may be used to implement the block diagram of FIG. 4.

The circuit of FIG. 5A includes the switching network 400, the comparator circuit 401 including the input chop circuits 410, 411, the NMOS input stage 413, the PMOS input stage 412, a cascode current mirror stage 500, the output chop circuits 414, 415, and the output stage 416.

The switching network 400 is coupled to the input chop circuits 410, 411. One input chop circuit 410 is coupled to the NMOS input stage 413. The other input chop circuit 411 is coupled to the PMOS input stage 412.

The NMOS input stage 413 and the PMOS input stage 412 each include a respective pair of differential input transistors 510, 511 and 520, 521. The NMOS input stage differential transistor pair 510, 511, in an embodiment, are NMOS transistors. The PMOS input stage differential transistor pair 520, 521 are PMOS transistors.

The current mirror stage 500 is a circuit designed to copy a current through one active device by controlling the current in another active device of a circuit, keeping the output current constant regardless of loading. The transistors of this stage 500 are cascoded in that they comprise a two-stage amplifier having a common source stage feeding into a common gate stage. Thus, the current mirror stage 500 controls the current from either the NMOS input stage 413 or the PMOS input stage 412 to keep the current in the other stage constant.

The current mirror stage 500 is coupled to the output chop circuits 414, 415 that remove the voltage offset from the amplifier input stages 412, 413. The outputs of the output chop circuits 414, 415 are fed into the output amplifier stage 416. This stage 416 generates the output voltage signals represented by $V_{outp}$. The feedback determines the scaling between $V_{outp}$ and $V_{inp}$.

The circuit of FIG. 5B is substantially the same as that of FIG. 5A except that the chop circuits 410, 411, 414, 415 have not been added in the circuit of FIG. 5B. Thus, the description of FIG. 5B is substantially the same as the description of the schematic of FIG. 5A with the exclusion of the chop circuits 410, 411, 414, 415.

Figure 6:
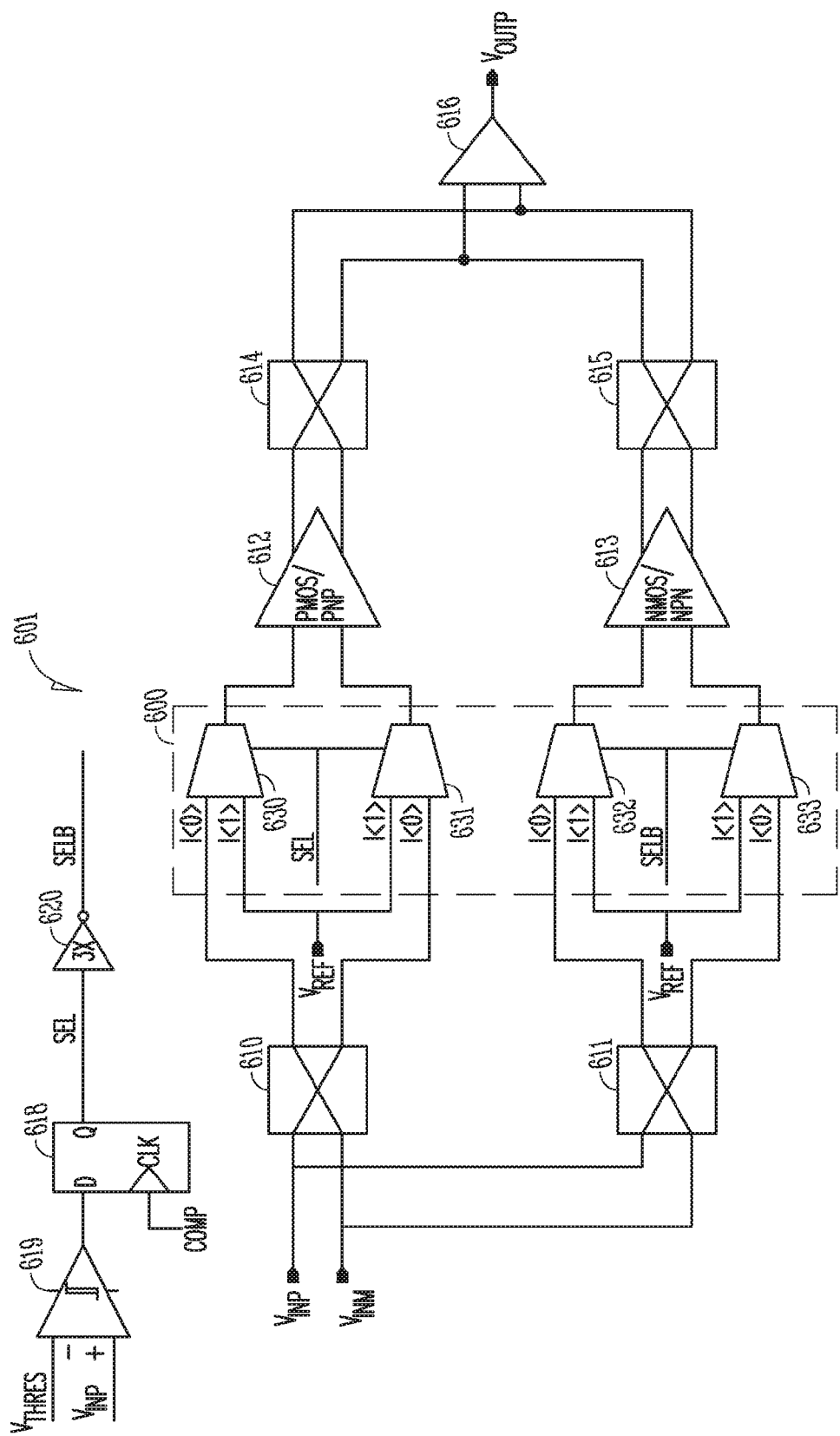
FIG. 6 is a block diagram of another example of an amplifier circuit with chopper circuits for offset voltage cancellation, such as in accordance with various embodiments.

FIG. 6 is a block diagram of another example of an amplifier circuit with chop circuits for offset voltage cancellation, such as in accordance with various embodiments. This embodiment differs from the embodiment of FIGS. 4 and 5 in that the input chop circuits 610, 611 are moved in front of the switching network 600.

The circuits include a switching network 600, comprising four multiplexers 630-633, chopper circuits 610, 611, 614, 615 (e.g., chopper function), complementary differential input amplifier stages 612, 613, an output stage 616, and a comparator circuit 601 comprising a comparator 619, a latch (e.g., D flip-flop) 618, and an inverter 620.

The differential input signals, represented by $V_{inp}$ and $V_{inm}$, are input to input chop circuits 610, 611. The input chop circuits 610, 611 chops any voltage offset from the input signals (e.g., $V_{inm}$, $V_{inm}$) prior to feeding these signals to their respective multiplexers 630-633.

The switching network 600 is coupled to the input chop circuits 610, 611 such that the differential input signals output from the chop circuits 610, 611 are input to the multiplexers 630-633. The reference signal node, represented by $V_{ref}$, is coupled to the same corresponding input of each multiplexer 630-633 (e.g., input<1>). The reference signal may be any voltage where both PMOS and NMOS pairs are completely on. Each switching network multiplexer 630-633 has a respective, corresponding input (e.g., input <0>) coupled to one of the input signal nodes (e.g., $V_{inp}$, $V_{inm}$). Based on the chop phase, input <0> of 630 will be connected to either $V_{inp}$ or $V_{inm}$. In one chop phase it will be connected to $V_{inp}$ and in the other chop phase it will be connected to $V_{inm}$. Similarly for the other multiplexers.

Each of the multiplexers 630-633 has a switching control input that is coupled to one of a switching select signal SEL or SELB. When the switching select signal SEL is in a first state, the switching select signal SELB signal is in a second state that is opposite to the first state. For example, when SEL is a logic low, SELB is a logic high. The switching select signals may then be used to switch between one of the two signals presented on the inputs of the respective multiplexer 630-633.

Each multiplexer 630-633 comprises a respective output that is coupled to an input of its respective input amplifier stage 612, 613. For example, the respective outputs of multiplexers 630, 631 are coupled to inputs of the first input amplifier stage 612. The respective outputs of multiplexers 632, 633 are coupled to inputs of the second input amplifier stage 613. In an embodiment, the first differential input stage 612 is a PMOS/PNP input stage 612 and the second differential input stage 613 is a NMOS/NPN input stage 613.

Outputs of the first and second differential input stages 612, 613 are respectively input to output chop circuits 614, 615. The outputs of output chop circuits 614, 615 are input to the output stage 616. The output stage is coupled to output signal nodes $V_{outp}$.

The comparator circuit 601 includes a comparator 619 coupled to one of the input signal nodes (e.g., $V_{inp}$) and a $V_{thres}$ signal. $V_{thres}$ represents threshold voltage to which the input signal voltage is compared. The comparator 619 may have hysteresis. The output of the comparator 619 is coupled to a latch or a flip-flop 618 (e.g., D flip-flop) that outputs the SEL select signal. The latch 618 is coupled to an inverter 620 that provides the opposite state SELB select signal.

In operation, the reference signal and the differential input signals $V_{inp}$ and $V_{inm}$ are applied to the input nodes of the switching network 600. One of the input signals (e.g., $V_{inp}$) is applied to the input of the comparator that compares the input signal to the threshold voltage Vies. If $V_{inp}$ is less than $V_{thres}$, the comparator outputs a low signal that is latched into the latch 618 by clock COMP. Thus, the select signal SEL transitions to a low signal and the select signal SELB transitions to a high signal. The low select signal SEL selects the "0" input of multiplexers 630, 631 so that the output of the multiplexers 630, 631 is the differential voltages $V_{inp}$ and $V_{inm}$. The high select signal SELB selects the corresponding "1" inputs of the multiplexers 632, 633 so that the output of the multiplexers 632, 633 is the reference voltage $V_{ref}$. Thus, the inputs to the input chop circuit 610 and its respective input stage 612 (e.g., PMOS/PNP input stage) is the differential voltages $V_{inp}$ and $V_{inm}$. The input to the input chop circuit 611 and its respective input stage 613 (e.g., NMOS/NPN input stage) is the reference voltage. Thus, while the PMOS input stage of the circuit is coupled to an input signal for amplification, the NMOS input stage is still operational with the reference voltage.

Conversely, if $V_{inp}$ is greater than $V_{thres}$, the comparator outputs a high signal that is latched into the latch 618 by clock COMP. Thus, the select signal SEL transitions to a high signal and the select signal SELB transitions to a low signal. The high select signal SEL selects the "1" input of multiplexers 630, 631 so that the output of the multiplexers 630, 631 is reference voltage $V_{ref}$. The low select signal SELB selects the "0" inputs of the multiplexers 632, 633 so that the output of the multiplexers 632, 633 is the differential voltages $V_{inp}$ and $V_{inm}$. Thus, the inputs to the input chop circuit 610 and its respective input stage 612 (e.g., PMOS/PNP input stage) is the reference voltage. The input to the input chop circuit 611 and its respective input stage 613 (e.g., NMOS/NPN input stage) is the differential voltages $V_{inp}$ and $V_{inm}$. Thus, while the NMOS input stage 613 of the circuit is coupled to an input signal for amplification, the PMOS input stage 612 is still operational with the reference voltage.

The input stages 612, 613 feed their respective signals into output chop circuits 614, 615. The output of the output chop circuits 614, 615 are then input to the amplifier output stage 616 to generate the output differential voltages $V_{outp}$.

Figure 7:
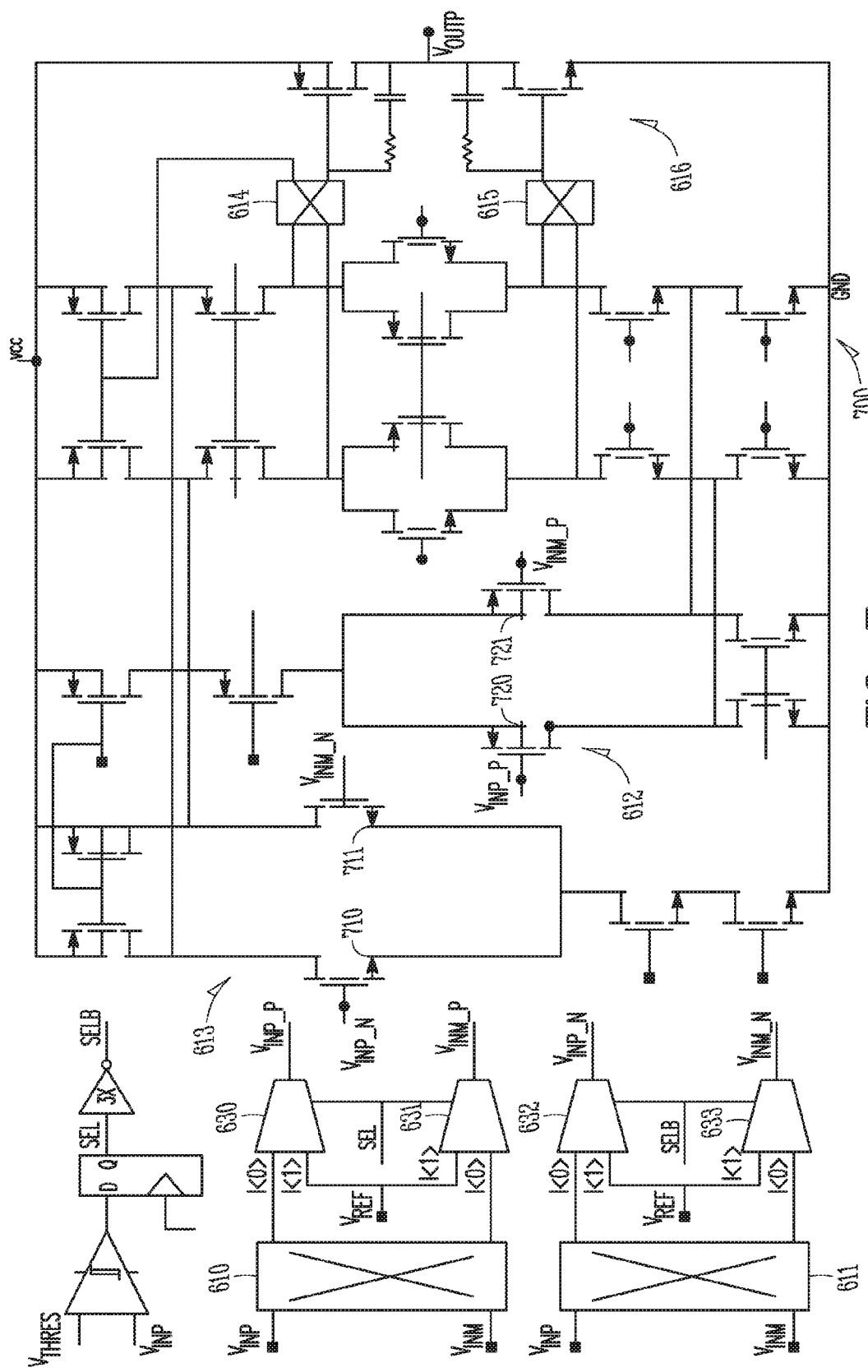
FIG. 7 is a schematic diagram of an example amplifier circuit with chopper circuits for offset voltage cancellation, such as in accordance with the embodiment of FIG. 6.

FIG. 7 is a schematic diagram of an example amplifier circuit with chop circuits for offset voltage cancellation, such as in accordance with the embodiment of FIG. 6. This schematic is for purposes of illustration only as other circuits may be used to implement the block diagram of FIG. 6.

The circuit of FIG. 7 includes the switching network 600, the comparator circuit 601 including the input chop circuits 610, 611, the NMOS input stage 613, the PMOS input stage 612, a cascode current mirror stage 700, the output chop circuits 614, 615, and the output stage 616.

The input differential signals $V_{inp}$ and $V_{inm}$ are input to the input chop circuits 610, 611. The input chop circuits 610, 611 are coupled to the switching network 600. One pair of multiplexers 630, 631 is coupled to the NMOS input stage 613. The other pair of multiplexers 632, 633 is coupled to the PMOS input stage 612.

The NMOS input stage 613 and the PMOS input stage 612 each include a respective pair of differential input transistors 710, 711 and 720, 721. The NMOS input stage differential transistor pair 710, 711, in an embodiment, are NMOS transistors. The PMOS input stage differential transistor pair 720, 721 are PMOS transistors.

The current mirror stage 700 is a circuit designed to copy a current through one active device by controlling the current in another active device of a circuit, keeping the output current constant regardless of loading. The transistors of this stage 700 are cascoded in that they comprise a two-stage amplifier having a common source stage feeding into a common gate stage. Thus, the current mirror stage 700 controls the current from either the NMOS input stage 613 or the PMOS input stage 612 to keep the current in the other stage constant.

The current mirror stage 700 is coupled to the output chop circuits 614, 615. The outputs of the output chop circuits 614, 615 are fed into the output amplifier stage 616. This stage 616 generates the output voltage signals represented by $V_{outp}$. The feedback determines the scaling between $V_{outp}$ and $V_{inp}$.

The benefits of the above embodiments may be illustrated by determining the change in the amplitude of the chopping ripple and the offset step. In fact, the change in the amplitude of the chopping ripple is the same as the offset step seen in amplifiers without chopping.

FIGS. 8A-8D illustrate plots of comparisons of simulation results for an offset step voltage for a conventional amplifier circuit versus an offset step voltage of various embodiments. These plots show the residual offset after chopping and the change in amplitude of chopping ripple.

Figure 8A:
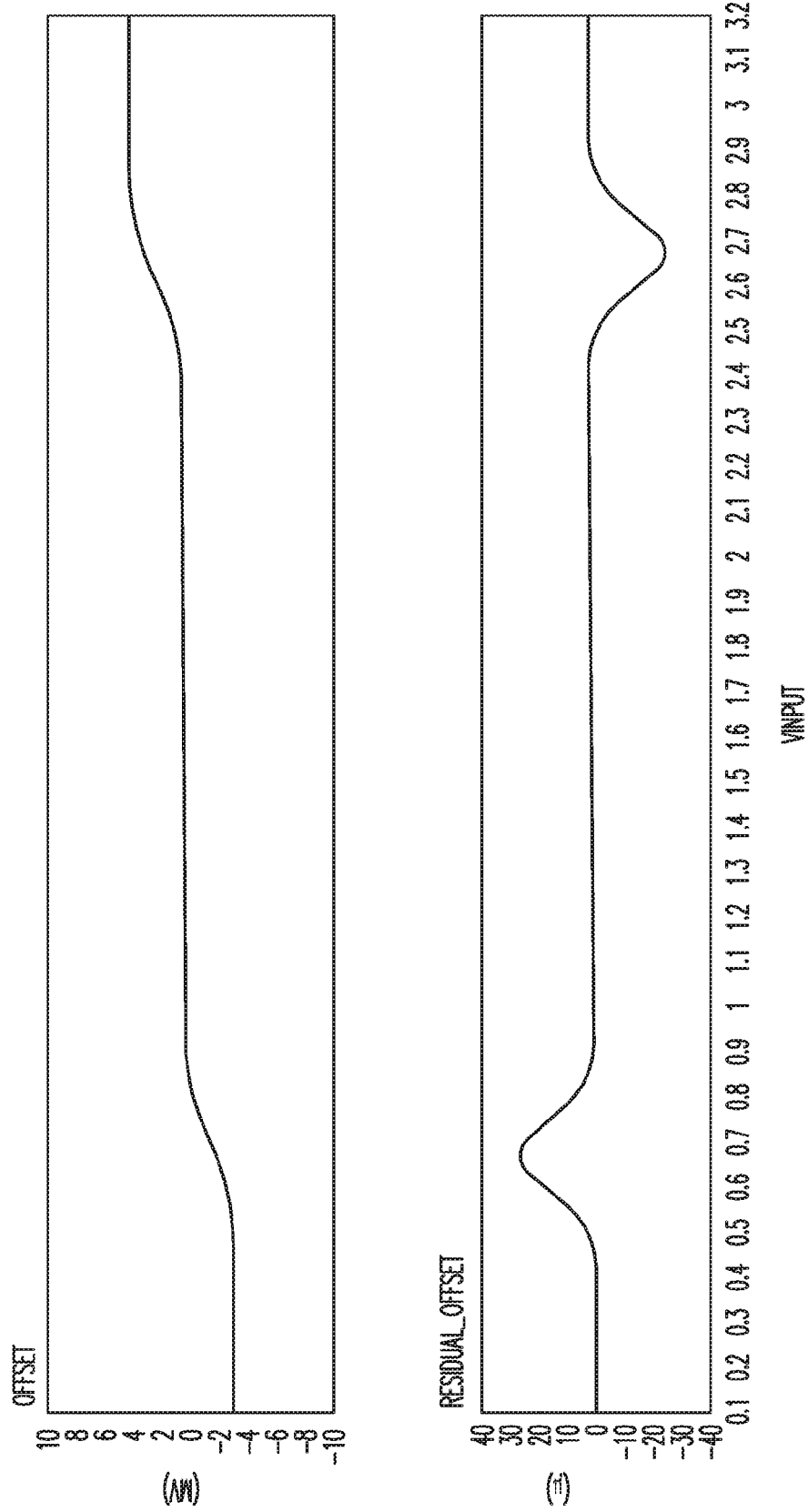
FIGS. 8A-8D illustrate plots of comparisons of simulation results for an offset step voltage for a conventional amplifier circuit versus an offset step voltage of various embodiments.

The top plot of FIG. 8A shows the offset step in mV versus input voltage. This is similar to the plot of FIG. 2. The bottom plot of FIG. 8A shows the residual offset in µV versus the input voltage after chopping. This is similar to the plot of FIG. 3.

Figure 8B:
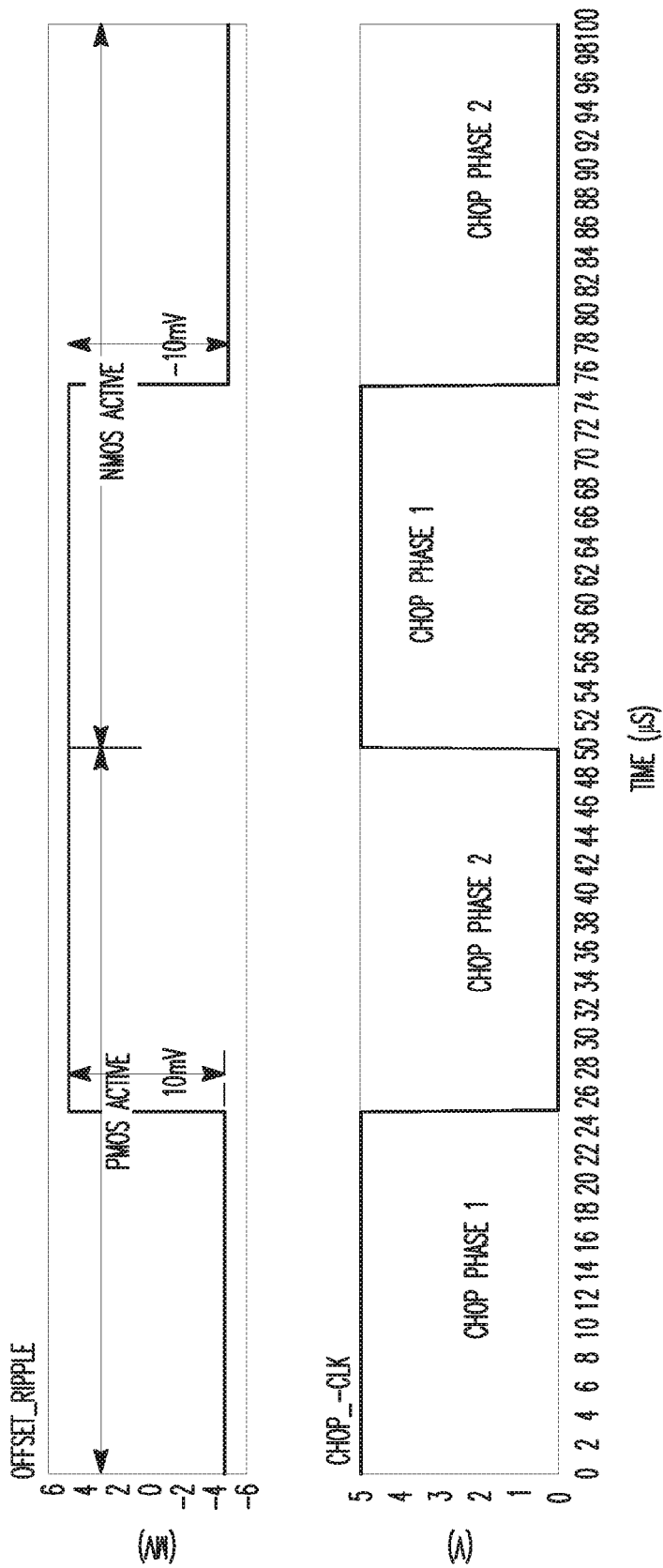

The top plot of FIG. 8B shows that the ripple amplitude, due to chopping, changes from 10 mV when the PMOS input differential pair is active to −10 mV when the NMOS input differential pair is active after 50 us. The bottom plot of FIG. 8B shows the various chopping phases relative to the top plot.

Figure 8C:
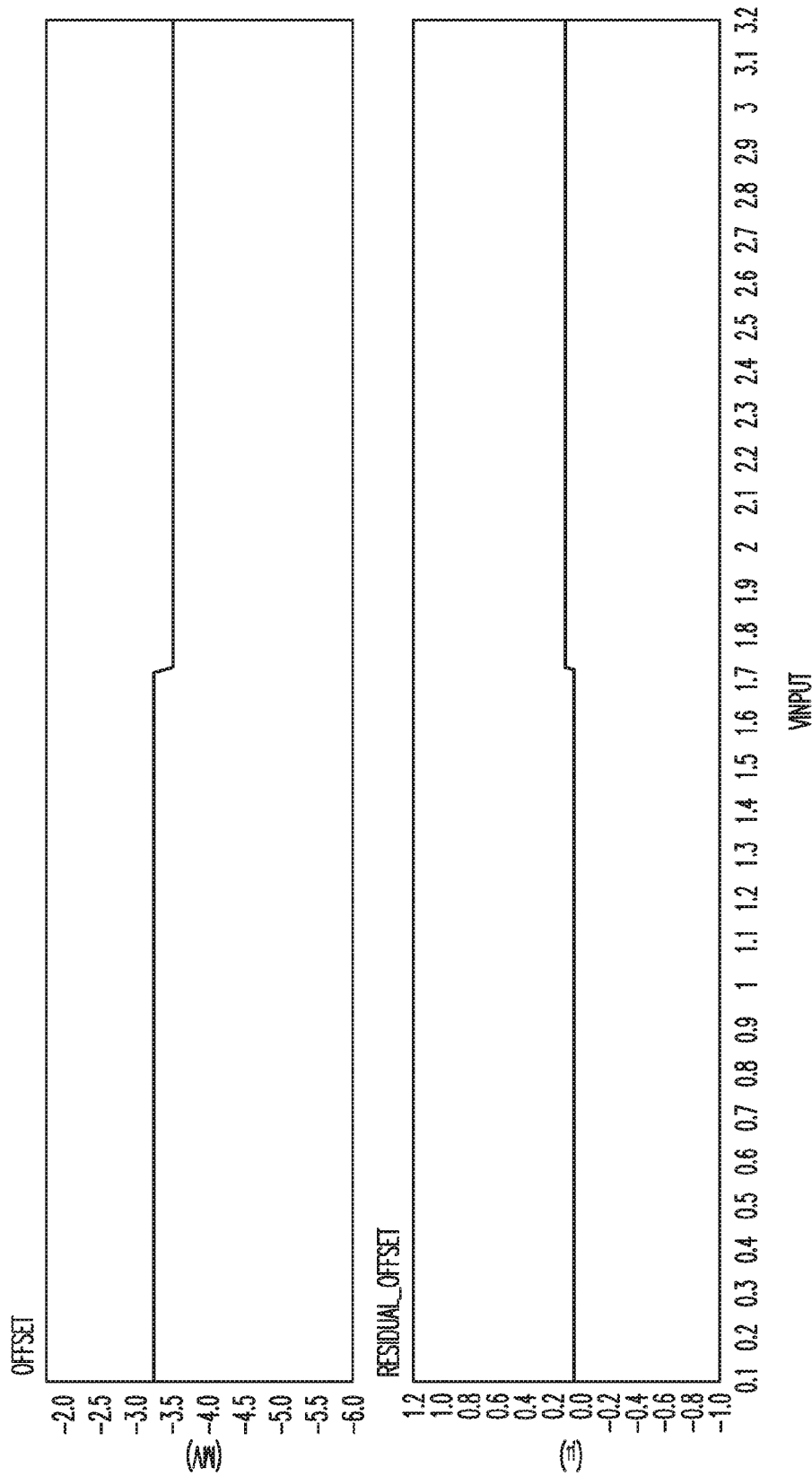

The top plot of FIG. 8C shows the offset step of the operational amplifier of various embodiments. It can be seen that the offset is fairly constant over the entire input range.

The bottom plot of FIG. 8C shows the residual offset after chopping. There are no spikes as seen in the bottom plot of FIG. 8A.

Figure 8D:
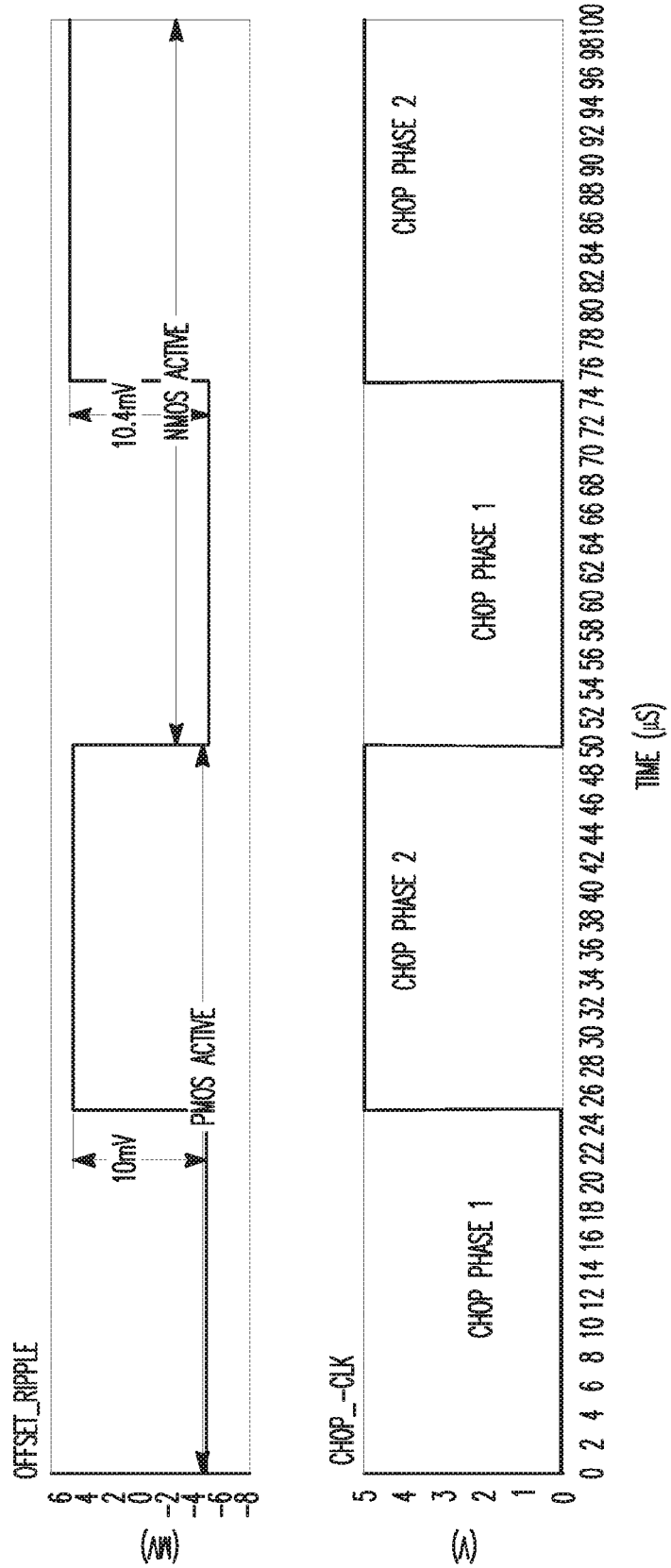

FIG. 8D is shows that difference in the amplitude of the chopping ripple is just 400 µV compared to 20 mV seen in the plot of FIG. 8B.

It can be seen from the plots of FIGS. 8A-8D that in embodiments where the input stages are not on at the same time, the offset voltage may get as high as approximately 6 mV. In the embodiments where both the input stages are on simultaneously, the offset voltage may be around 400 µV.

While chopping is the illustrated method for canceling the offset voltage of the amplifier circuits of FIGS. 4-7, another method may use auto-zeroing. The embodiments of FIGS. 9-11 assume the input differential voltage of FIG. 2. The varying input signal may not be auto-zeroed correctly because auto-zeroing at one point of an increasing input voltage may not correctly cancel the offset at another point having a different input voltage.

Figure 9:
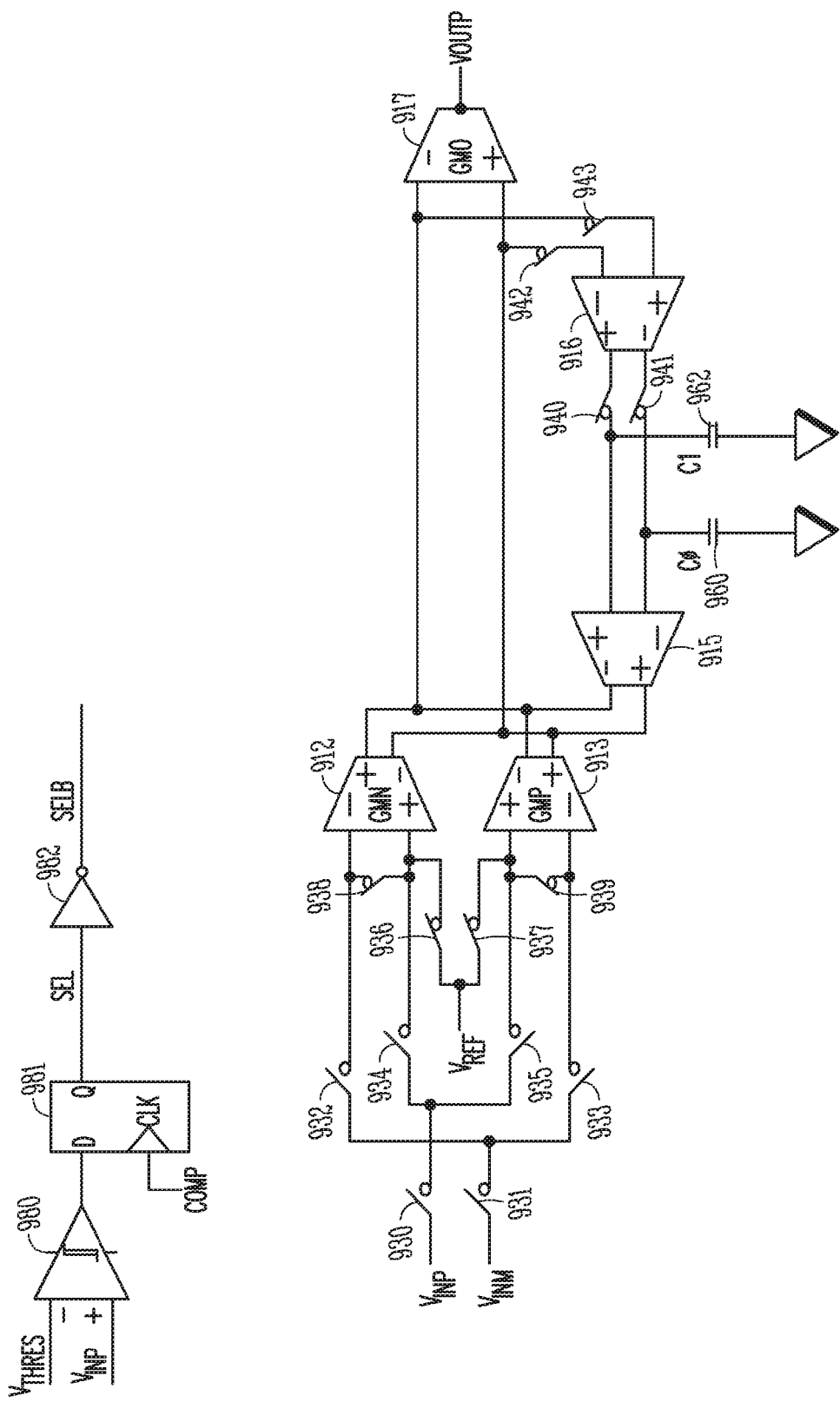
FIG. 9 is a block diagram of an auto-zero circuit, such as in accordance with various embodiments.

FIG. 9 is a block diagram of an auto-zero circuit, such as in accordance with various embodiments. The circuit includes block 912 representing the NMOS input stage, block 913 representing the PMOS input stage, block 917 representing the output stage, a plurality of input switches 930-939, auto-zero loop first stage block 916, auto-zero loop second stage block 915, and capacitances 960, 962. The auto-zero circuit may include a comparator circuit that includes a comparator 980, a latch or flip-flop (e.g., D flip-flop) 981, and an inverter 982.

Switches 930, 934 couple the $V_{inp}$ signal to the NMOS input stage block 912. Switches 930, 935 couple the $V_{inp}$ signal to the PMOS input stage block 913. Switches 931, 932 couple the $V_{inm}$ signal to the NMOS input stage block 912. Switches 931, 933 couple the $V_{inm}$ signal to the PMOS input stage block 913. Switches 936, 937 couple the reference voltage Vref to the respective inputs of the NMOS input stage block 912 and the PMOS input stage block 913. Shorting switches 938, 939 are coupled between the inputs of their respective input stage block 912, 913.

The differential outputs of the NMOS input stage block 912 and PMOS input stage block 913 are coupled to the differential inputs of secondary loop block 916, through switches 942, 943, and to the differential inputs of the output stage block 917 that outputs the $V_{outp}$ output voltage. The differential outputs of the first stage of the auto-zero loop block 916 are coupled to the inputs of the second stage of the auto-zero loop block 915 through switches 940, 941. Capacitances 960, 962 are coupled to the respective inputs of the auto-zero loop block 915. The amplifier block 916, amplifier block 915, coupling switches 940-943, and capacitances 960, 962 are part of a secondary loop that controls the auto-zero function.

The comparator circuit includes the comparator 980 coupled to one of the input signal nodes (e.g., $V_{inp}$) and a $V_{thres}$ signal. $V_{thres}$ represents a threshold voltage $V_{thres}$ can be generated separately and can be same as $V_{ref}$ that provides a reference voltage to which the input signal voltage is compared. The comparator 980 may have hysteresis. The output of the comparator 980 is coupled to a latch or a flip-flop 981 (e.g., D flip-flop) that outputs the SEL select signal. The latch 981 is coupled to an inverter 982 that provides the opposite state SELB select signal.

In operation, during the auto-zero phase, switches 936, 937 are closed so that $V_{ref}$ is coupled to the inputs of the NMOS and PMOS input stage blocks 912, 913. The shorting switches 938, 939 are closed at this time to short the respective inputs of these blocks 912, 913. Switches 940-943 are closed. The offset of the differential output of the NMOS/PMOS stages to in opposite directions, but the auto-zero loop ensures that they are brought close by injecting sufficient current from block 915. In this process the capacitors 960 and 962 are charged and preserved for the tracking phase of the amplifier.

Once the circuit is out of the auto-zero phase and is in the tracking phase, the comparator 980 selects which input differential pair needs to be connected to the input nodes $V_{inp}$ and $V_{inm}$. The unselected differential pair remains connected to the reference voltage $V_{ref}$. This is accomplished by opening only corresponding shorting switches 936, 937, 938, 939 and closing appropriate switches 930-935. Switches 940, 941 are open so that the offset voltage stored in the capacitances is not altered.

Thus, as in previous embodiments, both the selected and unselected input stages are active with either the differential input voltage (i.e., selected stage) or reference voltage (i.e., unselected stage). The auto-zero is valid no matter which input differential pair is selected.

Figure 10:
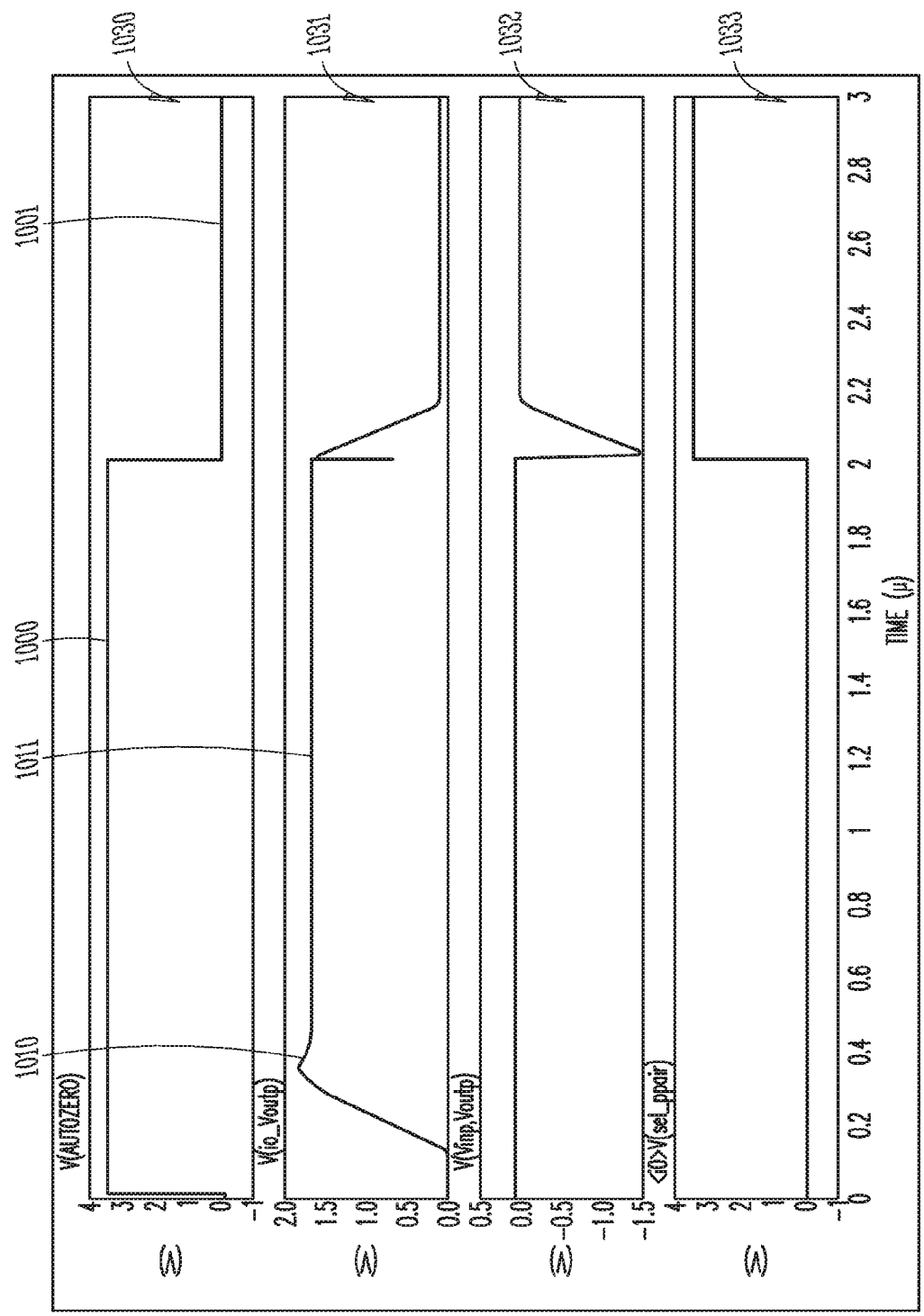
FIG. 10 are plots of the auto-zero operation, such as in accordance with various embodiments.

FIG. 10 are plots of the auto-zero operation, such as in accordance with various embodiments. The plots have time (in microseconds (μs)) along the x-axis and volts (V) along the y-axis.

The top plot 1030 shows the timing of the auto-zero phase 1000 and track phase 1001. Plot 1031 shows the output of the amplifier settles close to $V_{ref}$ 1011 during the auto-zero phase. Once the track phase 1001 is initiated, the output tracks the input voltage.

Plot 1032 shows the offset voltage. It can be seen that during the auto-zero phase 1000, some amount of offset greater than zero exists. Once the auto-zero phase 1000 is over and the track phase 1001 is initiated, the offset voltage is shown very close to zero volts.

Plot 1033 shows the comparator output that is zero during the auto-zero phase 1000 but during the track phase 1001 goes to a voltage to select the switch network to couple the differential input voltages to either the NMOS input stage or the PMOS input stage.

Figure 11:
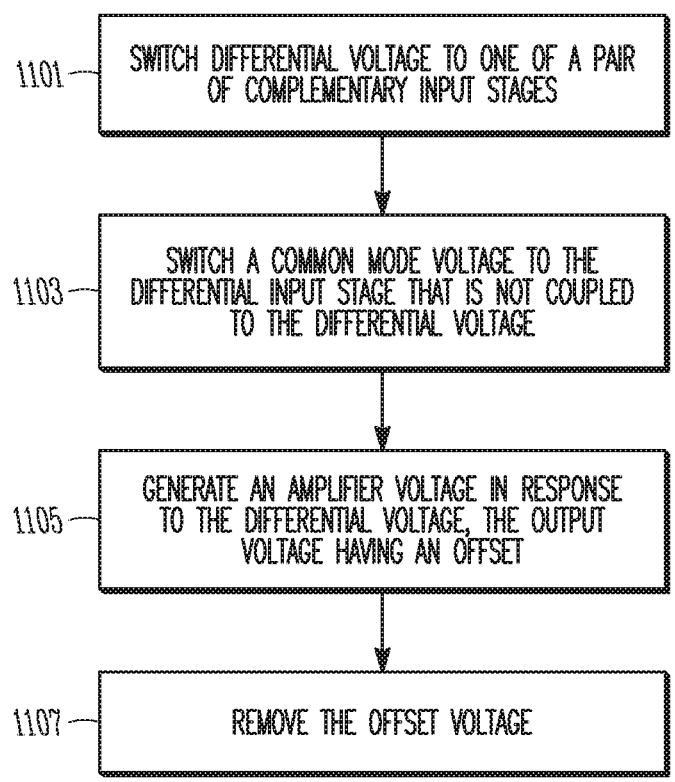
FIG. 11 is a flowchart of a method for amplifier offset voltage cancellation, such as in accordance with various embodiments.

FIG. 11 is a flowchart of a method for amplifier offset voltage cancellation, such as in accordance with various embodiments. In block 1101, a differential voltage is switched to a first of a pair of differential input stages. In block 1103, a reference voltage is switched to the differential input stage that is not coupled to the differential voltage. The reference voltage is switched to the other input stage while the differential voltage is coupled to the first differential input stage. In block 1105, an amplifier output voltage is generated in response to the differential voltage, the output signal has an offset voltage. In block 1107, the offset voltage is removed from the output voltage by either a chopper function or an auto-zero function.

Figure 12:
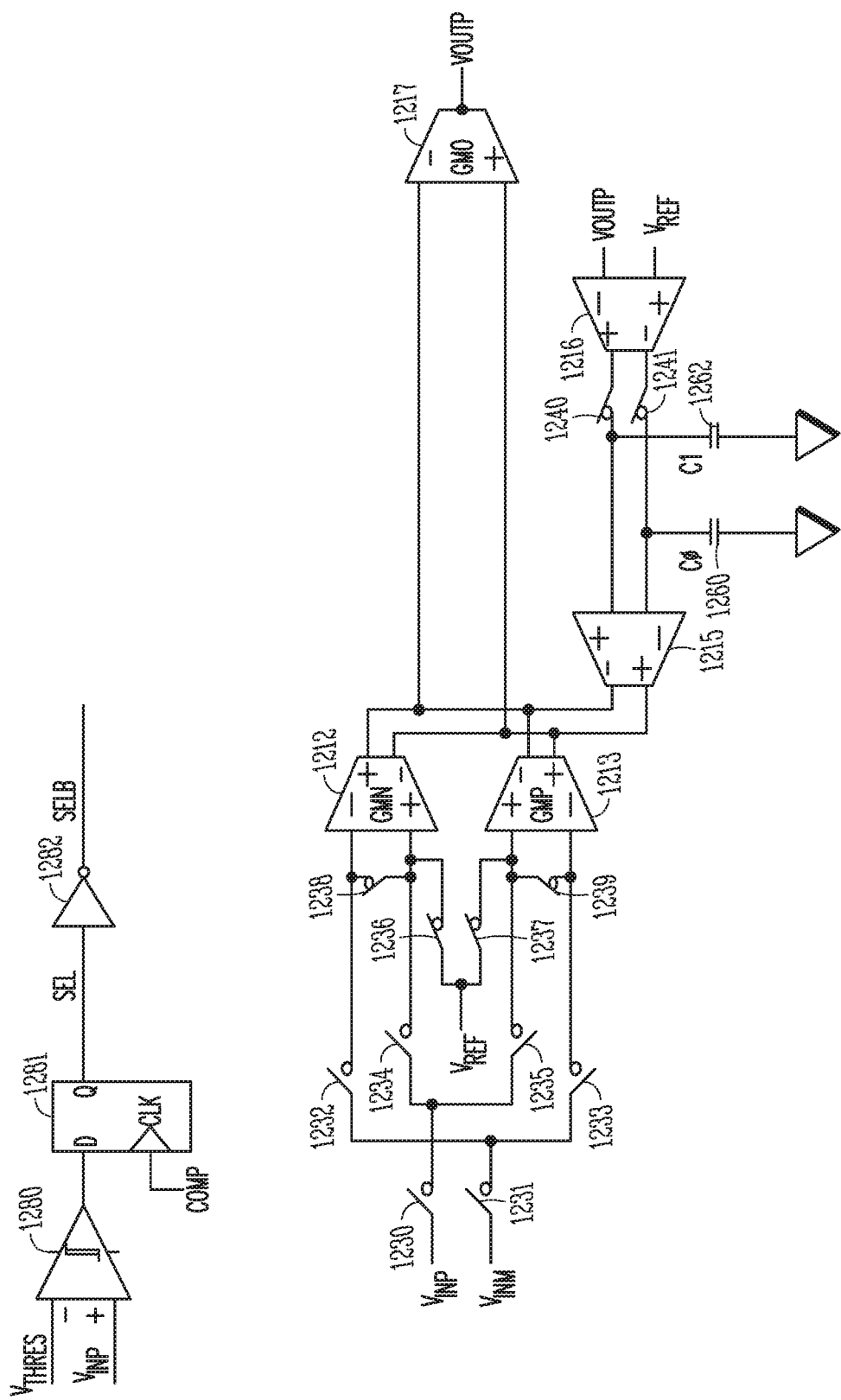
FIG. 12 is a block diagram of another auto-zero circuit, such as in accordance with various embodiments.

FIG. 12 is a block diagram of another auto-zero circuit, such as in accordance with various embodiments. The circuit includes block 1212 representing the NMOS input stage, block 1213 representing the PMOS input stage, block 1217 representing the output stage, a plurality of input switches 1230-939, auto-zero loop first stage block 1216, auto-zero loop second stage block 1215, and capacitances 1260, 1262. The auto-zero circuit may include a comparator circuit that includes a comparator 1280, a latch or flip-flop (e.g., D flip-flop) 1281, and an inverter 1282.

Switches 1230, 1234 couple the $V_{inp}$ signal to the NMOS input stage block 1212. Switches 1230, 1235 couple the $V_{inp}$ signal to the PMOS input stage block 1213. Switches 1231, 1232 couple the $V_{inm}$ signal to the NMOS input stage block 1212. Switches 1231, 1233 couple the $V_{inm}$ signal to the PMOS input stage block 1213. Switches 1236, 1237 couple the reference voltage $V_{ref}$ to the respective inputs of the NMOS input stage block 1212 and the PMOS input stage block 1213. Shorting switches 1238, 1239 are coupled between the inputs of their respective input stage block 1212, 1213.

The differential outputs of the NMOS input stage block 1212 and PMOS input stage block 1213 are coupled to the differential inputs of the output stage block 1217 that outputs the $V_{outp}$ output voltage. The output voltage $V_{outp}$ and the reference voltage $V_{ref}$ are coupled to the inputs of the first stage of the auto-zero loop block 1216. The differential outputs of the first stage of the auto-zero loop block 1216 are coupled to the inputs of the second stage of the auto-zero loop block 1215 through switches 1240, 1241. Capacitances 1260, 1262 are coupled to the respective inputs of the auto-zero loop block 1215. The amplifier block 1216, amplifier block 1215, and capacitances 1260, 1262 are part of a secondary loop that controls the auto-zero function.

The comparator circuit includes the comparator 1280 coupled to one of the input signal nodes (e.g., $V_{inp}$) and a $V_{thres}$ signal. $V_{thres}$ represents a threshold voltage $V_{thres}$ can be generated separately and can be same as $V_{ref}$ that provides a reference voltage to which the input signal voltage is compared. The comparator 1280 may have hysteresis. The output of the comparator 1280 is coupled to a latch or a flip-flop 1281 (e.g., D flip-flop) that outputs the SEL select signal. The latch 1281 is coupled to an inverter 1282 that provides the opposite state SELB select signal.

In operation, during the auto-zero phase, switches 1236, 1237 are closed so that $V_{ref}$ is coupled to the inputs of the NMOS and PMOS input stage blocks 1212, 1213. The shorting switches 1238, 1239 are closed at this time to short the respective inputs of these blocks 1212, 1213. The offset of the amplifier tries to pull the differential output of the NMOS/PMOS stages to in opposite directions, but the auto-zero loop ensures that they are brought close by injecting sufficient current from block 1215. In this process the capacitors 1260 and 1262 are charged and preserved for the tracking phase of the amplifier.

Once the circuit is out of the auto-zero phase and is in the tracking phase, the comparator 1280 selects which input differential pair needs to be connected to the input nodes $V_{inp}$ and $V_{inm}$. The unselected differential pair remains connected to the reference voltage $V_{ref}$. This is accomplished by opening only corresponding shorting switches 1236, 1237, 1238, 1239 and closing appropriate switches 1230-1235. Switches 1240, 1241 are open so that the offset voltage stored in the capacitances is not altered.

The switching of the differential voltage includes switching the differential voltage to an n-type input stage of the pair of differential input stages when the input voltage is greater than the threshold voltage and switching the differential voltage to a p-type input stage of the pair of differential input stages when the input voltage is less than the threshold voltage.

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An amplifier circuit that generates an output voltage comprising a relatively constant offset voltage, the amplifier circuit comprising:
   an output stage configured to generate the output voltage;
   first and second differential input stages coupled to the output stage, wherein the first differential input stage includes a pair of first input transistors and the second differential input stage includes a pair of second input transistors complementary in type to the first input transistors;
   a switching network configured to couple a differential input signal to the first differential input stage and a reference voltage to the second differential input stage in response to a control signal having a first state, and to couple the differential input signal to the second differential input stage and the reference voltage to the first differential input stage in response to the control signal having a second state; and
   a comparator configured to generate the control signal based on comparing a signal level of the differential input signal to a threshold signal.

2. The amplifier circuit of claim 1, wherein the output voltage is differential or single ended.

3. The amplifier circuit of claim 1, wherein the switching network is further configured to switch a positive input signal component of the differential input signal to one transistor of the first input transistors and a negative input signal component of the differential input signal to another transistor of the first input transistors in response to the control signal having the first state and the switching network further configured to switch the positive input signal component to one transistor of the second input transistors and the negative input signal component to another transistor of the second input transistors in response to the control signal having the second state.

4. The amplifier circuit of claim 1, further comprising a cascode current mirror stage coupled between each of the first and second differential input stages and the output stage.

5. The amplifier circuit of claim 4, wherein each of the first and second differential input stages are directly connected to the cascode current mirror stage and the cascode current mirror stage is directly connected to the output stage.

6. The amplifier circuit of claim 1, further comprising circuitry configured to provide an auto-zero function or a chopper function to remove offset voltage.

7. The amplifier circuit of claim 6, wherein the circuitry comprises a plurality of chopper circuits.

8. The amplifier circuit of claim 7, wherein the plurality of chopper circuits include input chopper circuits coupled to the switching network and output chopper circuits coupled between the differential input stages and the output stage.

9. The amplifier circuit of claim 8, wherein the input chopper circuits are coupled between the switching network and the differential input stages.

10. The amplifier circuit of claim 8, wherein the input chopper circuits are coupled between the differential input signal nodes and the switching network.

11. The amplifier circuit of claim 6, wherein the circuitry comprises a secondary feedback loop having a capacitance to store the offset correction voltage to provide auto-zeroing.

12. An amplifier circuit that removes offset voltages from an output voltage, the amplifier circuit comprising:
   an output stage configured to generate the output voltage;
   first and second differential input stages coupled to the output stage, wherein the first differential input stage includes a pair of first input transistors and the second differential input stage includes a pair of second input transistors complementary in type to the first input transistors;
   a comparator circuit configured to generate a control signal based on comparing an input signal to a threshold signal;
   a switching network coupled to the comparator circuit and configured to select one of the first differential input stage or the second differential input stage by switching the input signal to the selected stage in response to the control signal, wherein an unselected stage of the first or second differential input stage is active; and
   circuitry configured to provide at least one of a chopper function or an auto-zero function that removes the offset voltage.

13. The amplifier circuit of claim 12, wherein the switching network switches a reference signal to the unselected stage while the input signal is switched to the selected stage.

14. The amplifier circuit of claim 12, wherein the circuitry comprises:
   a respective input chopper circuit coupled between the switching network and each of the first and second differential input stages; and
   a respective output chopper circuit coupled between each of the first and second differential input stages and the output stage.

15. The amplifier circuit of claim 12, wherein the switching network comprises a first pair of multiplexers coupled to the first differential input stage and a second pair of multiplexer coupled to the second differential input stage.

16. A method for signal amplification with offset voltage removal, the method comprising:
   generating a control signal based on comparing a voltage level of a differential voltage to a threshold voltage;
   switching the differential voltage to a pair of first input transistors and switching a reference voltage to a pair of second input transistors in a first state of the control signal, the second input transistors complementary in type to the first input transistors;
   switching the differential voltage to the pair of second input transistors and switching the reference voltage to the pair of first input transistors in a second state of the control signal;
   generating an amplifier output voltage using the pair of first input transistors and the pair of second input transistors, the amplifier output voltage having an offset voltage; and
   removing the offset voltage from the amplifier output voltage.

17. The method of claim 16, wherein generating the control signal comprises comparing a first signal component of the differential voltage to the threshold voltage.

18. The method of claim 16, wherein removing the offset voltage comprises using a chopping function to remove the offset voltage.

19. The method of claim 16, wherein removing the offset voltage comprises using an auto-zero function to remove the offset voltage.

20. The amplifier circuit of claim 1, wherein the comparator circuit is configured to generate the control signal in response to a difference between a first signal component of the differential input signal and the threshold signal.

21. The amplifier circuit of claim 12, wherein the input signal is a differential input signal, wherein the comparator circuit is configured to generate the control signal based on a comparing a first signal component of the differential input signal to the threshold signal.

22. The amplifier circuit of claim 1, wherein pair of first input transistors is a pair of p-type metal oxide semiconductor (PMOS) transistors, and the pair of second input transistors is a pair of n-type metal oxide semiconductor (NMOS) transistors.

* * * * *